United States Patent
Lof et al.

(10) Patent No.: US 7,420,676 B2
(45) Date of Patent: Sep. 2, 2008

(54) ALIGNMENT METHOD, METHOD OF MEASURING FRONT TO BACKSIDE ALIGNMENT ERROR, METHOD OF DETECTING NON-ORTHOGONALITY, METHOD OF CALIBRATION, AND LITHOGRAPHIC APPARATUS

(75) Inventors: Joeri Lof, Eindhoven (NL); Fransiscus Godefridus Casper Bijnen, Valkenswaard (NL); Henricus Wilhelmus Maria Van Buel, Eindhoven (NL); Gerardus Johannes Joseph Keijsers, Venlo (NL); Robertus Victorius Maria Scheepens, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 476 days.

(21) Appl. No.: 10/900,393

(22) Filed: Jul. 28, 2004

(65) Prior Publication Data

US 2006/0023214 A1    Feb. 2, 2006

(51) Int. Cl.
*G01B 11/00* (2006.01)
*G03F 9/00* (2006.01)
*G03C 5/00* (2006.01)

(52) U.S. Cl. ............................ 356/401; 430/22; 430/30

(58) Field of Classification Search ............... None
See application file for complete search history.

(56) References Cited

U.S. PATENT DOCUMENTS

| 5,298,988 | A   | * | 3/1994  | Everett et al. | 348/87  |
|-----------|-----|---|---------|----------------|---------|
| 5,929,997 | A   | * | 7/1999  | Lin            | 356/401 |
| 6,376,329 | B1  | * | 4/2002  | Sogard et al.  | 438/401 |
| 7,057,707 | B2  | * | 6/2006  | Hansen         | 355/55  |
| 7,292,339 | B2  | * | 11/2007 | Lof            | 356/401 |
| 2002/0109825 | A1 | * | 8/2002 | Gui et al.    | 355/53  |

FOREIGN PATENT DOCUMENTS

EP         1341046 A2 *   9/2003

* cited by examiner

Primary Examiner—Gregory J. Toatley, Jr.
Assistant Examiner—Gordon J Stock, Jr.
(74) Attorney, Agent, or Firm—Pillsbury Winthrop Shaw Pittman, LLP (57) ABSTRACT

In a method of measuring front to backside alignment error according to one embodiment, a transparent substrate has a plurality of marks on both the front and backside. The relative location of the marks on the front and backside of the substrate is determined to calculate the front to backside alignment error for the whole substrate. In a further embodiment, the substrate is rotated by 180° within the plane of the substrate and the front relative location of the marks is again determined.

25 Claims, 7 Drawing Sheets

ALIGNMENT METHOD, METHOD OF MEASURING FRONT TO BACKSIDE ALIGNMENT ERROR, METHOD OF DETECTING NON-ORTHOGONALITY, METHOD OF CALIBRATION, AND LITHOGRAPHIC APPARATUS

FIELD OF THE INVENTION

The present invention relates to lithographic apparatus and methods of using such apparatus.

BACKGROUND INFORMATION

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning structure is at a desired position, for example with respect to the projection system. Any use of the terms "reticle" or "mask" herein may be considered synonymous with the more general term "patterning devices".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Before exposing the substrate, it may be desirable or necessary to correctly align it, e.g. to ensure that the functional features are imaged onto the correct position on the substrate. Complementary alignment marks $M_1$, $M_2$ and substrate marks $P_1$, $P_2$ are present on a mask and substrate respectively, and an alignment system is used to detect alignment. Examples of alignment systems are a conventional through the lens alignment system and also the alignment methods and apparatus described in co-pending European application numbers 02251440 and 02250235.

The marks are commonly on the front side of the substrate, but can also be on the backside of the substrate. Marks on the backside of the substrate are used, for example, when exposure is to take place on both sides of the substrate. This occurs particularly in the manufacture of micro electro mechanical systems (MEMS) or micro opto-electro mechanical systems (MOEMS).

Figure 2:
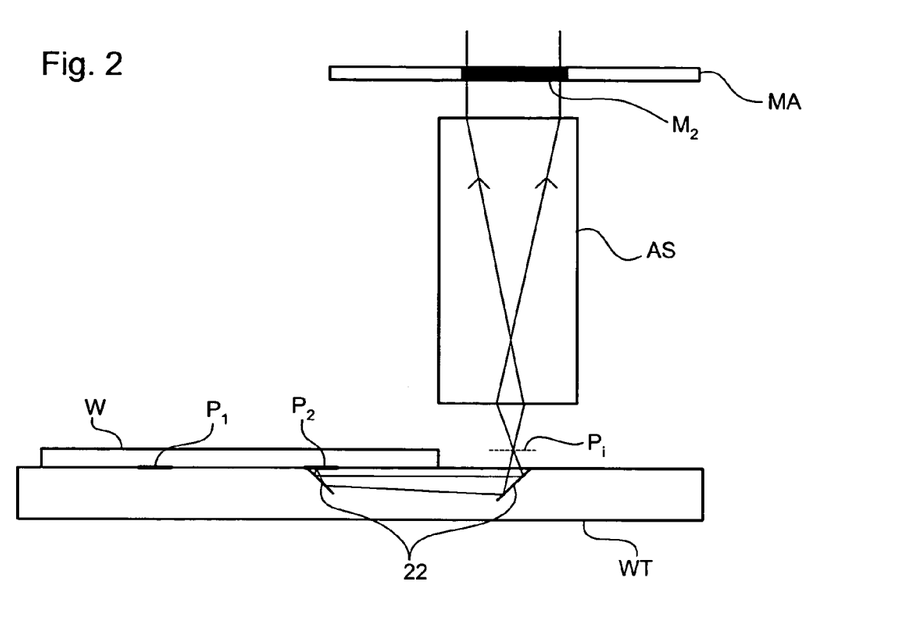
FIG. 2 shows typical front-to-backside alignment optics.

When the substrate marks $P_1$ and $P_2$ are on the back surface of the substrate, they may be re-imaged by front-to-back side alignment optics 22 at the side of substrate W to form an image $P_i$ as shown for $P_2$ in FIG. 2 of the accompanying drawings ($P_1$ would be re-imaged by e.g. another branch of the front-to-back side alignment optics). For each apparatus, the distance between the image $P_i$ and the substrate mark $P_2$ is known, and thus the front-to-backside alignment offset for each branch of the front-to-backside alignment optics is known. The front-to-back side alignment optics, together with the alignment system AS are thus used to determine the relative position of marks on the front side of the substrate to marks on the back side of the substrate. This enables functional features exposed on the front side of the substrate to be correctly lined up with functional features exposed on the backside of the substrate.

Although considerable efforts are made to ensure that the positioning of the substrate during an exposure is as accurate as possible, position errors nevertheless remain. These may be of the order of 10-20 nm in a stepper or 5-10 nm in a scanner and are generally tolerable within an overall overlay budget of perhaps 100-500 nm. Furthermore, since in many cases the positioning errors are found to be systematic and characteristic for stage movement speed and/or direction, if all layers of a device are imaged using the same sequence of stage movement, the positioning errors in each layer may be expected to have the same or similar magnitude and direction, such that the overlay error may be reduced. In many cases, the absolute position of the devices on a substrate is less important than the front-to-backside alignment error, that is the error in position of a layer relative to the layers above and below it, in which case the residual positioning errors can be tolerated.

The printing of devices on both the front and back sides of a substrate (i.e. on both principal surfaces of the substrate) imposes considerably stricter requirements on the absolute positioning accuracy, e.g. because the overlay error between front and backside devices may be up to twice the absolute positioning error.

SUMMARY

According to one embodiment, a method of measuring front-to-backside alignment error comprises providing a projection beam of radiation using an illumination system; providing a substrate that is transparent to an alignment beam of radiation; using first patterning structure to impart the projection beam with a first pattern in its cross-section; projecting a first pattern beam of radiation onto first side of the substrate to create a first mark; turning the wafer over; aligning the substrate; using second patterning structure to impart the projection beam with a second pattern in its cross section; projecting the second pattern beam of radiation onto the second side of the substrate to create a second mark; detecting the position of the first mark on the first side of the substrate using said alignment beam; and detecting the position of the second mark on the second side of the substrate using said alignment beam; wherein the substrate remains stationary relative to the substrate table holding the substrate between the first and second detection steps to measure the displacement, $\underline{d}_1$, between the first mark and the second mark in the plane of the substrate.

According to a further embodiment, a method of detecting non-orthogonality in a substrate table comprises placing a substrate on the substrate table and measuring a first set of at least two non-parallel displacements of said substrate; turning the substrate over; and measuring a second set of at least two non-parallel displacements of said substrate; wherein the average of the first set of displacements and the second set of displacements indicates the non-orthogonality of the substrate table.

In at least some arrangements of such an embodiment, non-orthogonality in the motion of the substrate table can therefore be accurately calculated and compensated for. It could, for example, be compensated for in software.

According to a further embodiment, a method of calibrating a lithographic apparatus comprises providing a substrate; providing a first projection beam of radiation using an illumination system; using first patterning structure to impart the projection beam with a pattern in its cross-section; projecting the first patterned beam of radiation onto a target portion of the first side of the substrate to create a first pattern; turning the substrate over; aligning the substrate using front to back side alignment optics; providing a second projection beam of radiation using an illumination system; using second patterning structure to impart the second projection beam with a second pattern in its cross-section; projecting the second patterned beam of radiation onto a target portion of the second side of said substrate to create a second pattern, the first and second pattern creating a device; and testing the operation of the device to determine the effectiveness of the overlay between the first pattern and the second pattern.

Implementations of such a method may comprise detecting the position of the alignment mark not through the front to back side alignment optics; and detecting the position of the alignment mark through the front to back side alignment optics.

According to a further embodiment, a lithographic apparatus comprises an illumination system for providing a projection beam of radiation; a support structure for supporting patterning structure, the patterning structure serving to impart the projection beam with a pattern in its cross-section; a substrate table for holding a substrate; a projection system for projecting the patterned beam onto a target portion of the substrate; front to back side alignment optics for reflecting an image of the back side of the substrate; and an alignment mark etched into the object window of the front to back side alignment optics.

According to a further embodiment, a method of calibrating lithographic apparatus comprises providing a substrate having a first mark on a first side of the substrate and a second mark on a second side of the substrate, at least one of the first and second marks being provided in a non-central position on the surface of the substrate; detecting a first position of the first mark on the substrate and detecting a first position of the second mark on the substrate without moving the substrate relative to the substrate table holding the substrate to measure a first distance between the first and second marks; translationally moving the substrate in the plane of the substrate; detecting a second position of the first mark on the substrate and detecting a second position of the second mark on the substrate without moving the substrate relative to the substrate table holding the substrate to measure a second distance between the first and second mark; wherein the difference between the first distance between the first and second marks and the second distance between the first and second marks indicate the rotational error in alignment.

According to a further embodiment, a method of calibrating lithographic apparatus comprises providing a substrate having a first mark and a second mark on a first side and a third mark and a fourth mark on a second side; detecting a first relative position between the first and third marks; translationally moving the substrate within the plane of said substrate; detecting a second relative position between the second and fourth marks; wherein the difference between said relative positions indicates the rotational error in alignment.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

One problem that may result from the present use of front-to-backside alignment optics is that the front-to-backside alignment error is only known for the positions on the substrate corresponding to the object windows of the front-to-backside alignment optics. Furthermore, any non-perpendicularity in the beam used to detect the front-to-backside alignment error can result in an inaccuracy in the calculation of the front-to-backside alignment error.

At least some embodiments of the present invention may be applied to provide an improved method of measuring front-to-backside alignment error.

Figure 1:
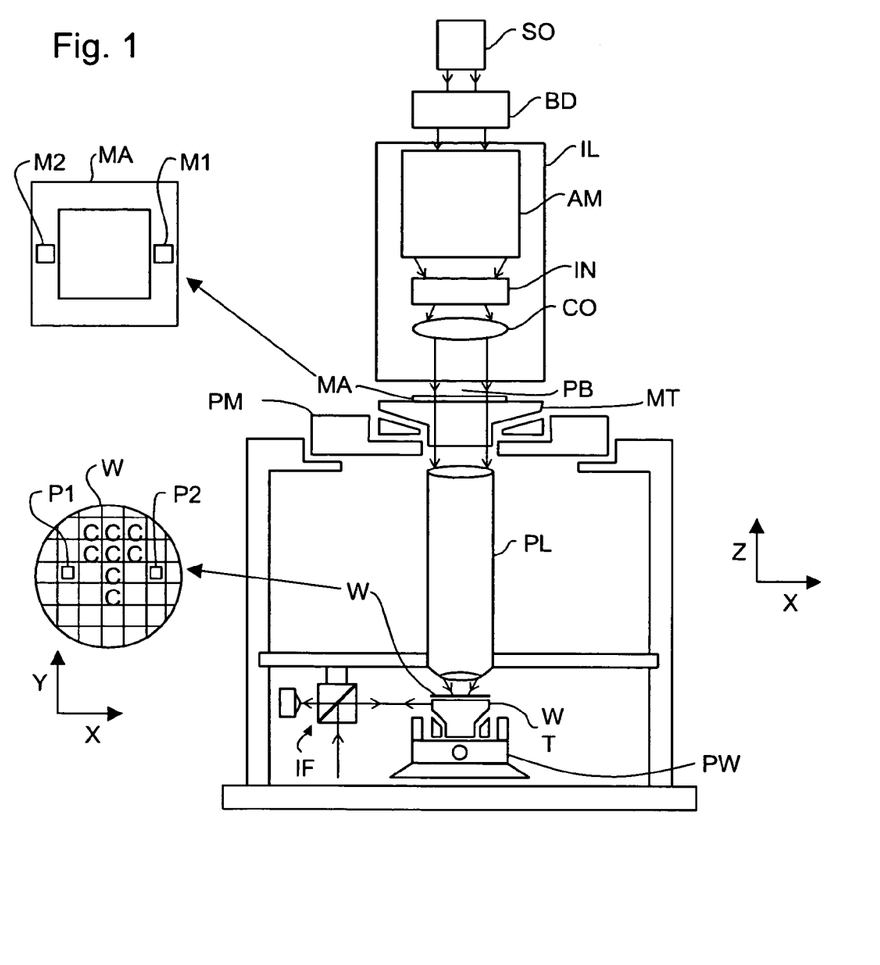
FIG. 1 depicts a lithographic apparatus according to an embodiment of the invention.

FIG. 1 schematically depicts a lithographic apparatus according to a particular embodiment of the invention. The apparatus comprises an illumination system (illuminator) IL configured to provide a projection beam PB of radiation (e.g. UV radiation); a first support structure (e.g. a mask table) MT configured to support a patterning device (e.g. a mask) MA and connected to a first positioning device PM configured to accurately position the patterning device with respect to item PL; a substrate table (e.g. a wafer table) WT configured to hold a substrate (e.g. a resist-coated wafer) W and connected to a second positioning device PW configured to accurately position the substrate with respect to item PL; and a projection system (e.g. a refractive projection lens) PL configured to image a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 3A:
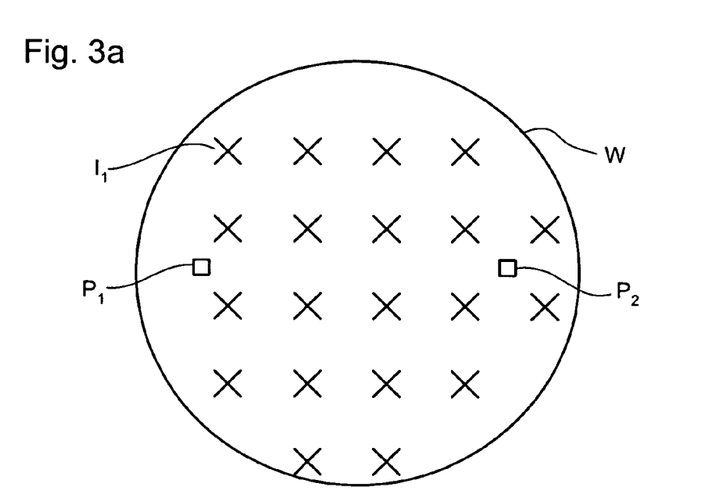
FIG. 3A is a plan view of a transparent substrate partway through a method according to a first embodiment of the invention.
Figure 3B:
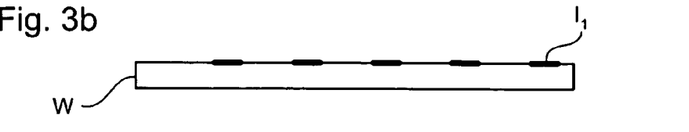
FIG. 3B is a cross-section of the substrate shown in FIG. 3A.

Mask $M_1$ has a repeating pattern and is placed in the path of projection beam PB. A repeating pattern $I_1$ is thus imaged onto and etched into a substrate W that is transparent to the radiation of projection beam PB. Also on the substrate W there are two alignment marks $P_1$ and $P_2$ which differ from the repeating pattern. As shown in FIGS. 3A and 3B, particular applications may include a space between each repeating element of the pattern which is at least as large as the pattern itself. The pattern extends across the whole surface of the substrate W. The substrate is then turned over and again placed on the substrate table WT. Front-to-backside alignment optics are used to project an image of the alignment marks $P_1$, $P_2$ to the front side and the substrate is aligned using these images and an alignment system AS.

Figure 4A:
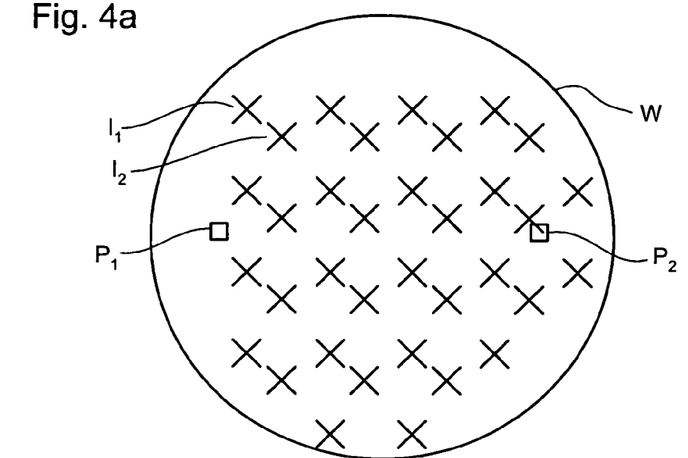
FIG. 4A is a plan view of the substrate of FIG. 3 at a later stage in a method according to a first embodiment of the invention.
Figure 4B:
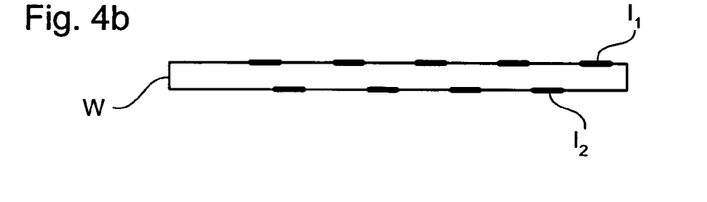
FIG. 4B is a cross-section of the substrate shown in FIG. 4A.

Mask $M_1$ is removed from the projection beam PB and mask $M_2$ placed in the projection beam PB instead. Mask $M_2$ has a repeating pattern, the elements of which are a mirror image of the elements of the repeating pattern on mask $M_1$. At a known offset from the repeating pattern $I_1$, and in the spaces between repeating pattern $I_1$, the repeating pattern of $M_2$ is imaged onto and etched into the second side of transparent substrate W to form image $I_2$. Because the repeating elements of $M_2$ are a mirror image of the repeating elements of $M_1$, $I_1$, and $I_2$ look the same, as shown in FIGS. 4A and 4B.

An alignment system is used to detect the location of an element of repeating pattern $I_2$. The substrate table WT is then shifted such that the other side of the transparent substrate W is in the focal plane of the alignment system and the element of $I_1$, corresponding to the detected element of $I_2$ is then detected. The relative location of $I_1$ and $I_2$ is compared to the known offset between patterns $I_1$, and $I_2$ to determine the front-to-backside alignment error for that position on the substrate. This process is repeated for each repeating element of the pattern $I_2$ to determine front-to-backside alignment error for all positions on the substrate.

Although the repeating elements on mask $M_2$ are here described as being the mirror image of the repeating elements on $M_1$, they need not necessarily be. Indeed a single mask $M_1$ may be used for the exposure of both sides of the substrate, for example with each repeating element having mirror symmetry. Indeed, the pattern need not be repeating and each element could be different, although such an arrangement may complicate determination of the relative positions.

Alignment marks $P_1$ and $P_2$ differing from the repeating pattern are described here although the elements of the repeating pattern could equally well be used for alignment purposes.

The apparatus used for the alignment part of the process may, as described here, be the same as that used for the exposure part of the process or may be different, but the apparatus calibrated will be the one used for the exposure part of the process. The projection system may indeed form part of the alignment system.

The front-to-backside alignment error can therefore be simply and easily measured. The substrate should remain stationary relative to the substrate table between the two detecting steps but the detection need not be carried out by the apparatus to be calibrated. Preferably the apparatus used to detect the marks should be capable of focusing over the entire range of the depth of the substrate. Alternatively the error involved in aligning to an out-of-focus alignment mark can be calculated and used to compensate for any errors. Alternatively, a higher refractive index material could be used to extend the focal point. The detection steps are carried out by a detection system and the relative position of the substrate and the detection system may be changed between the detection steps to ensure the first and second marks are in the focal plane of the detection system during the detection steps.

According to such an embodiment of the invention, front to back side alignment optics are used to align the wafer. The error generated by using front to back side alignment optics is therefore measured. However, this calibration method can be used to calibrate any method of aligning a substrate.

There are preferably a plurality of first marks and a plurality of second marks, each second mark corresponding to a first mark. The marks should ideally be arranged to cover as large an area of the substrate as possible. The displacement between each first mark and corresponding second mark is measured, and the front-to-backside alignment error over the entire wafer surface is therefore measured, thus measuring the front-to-backside alignment error of the complete image field of the lens.

Preferably the second mark is a mirror image of the first mark. The detection system can then easily detect both the first and second marks without necessitating any change in reference marks. The substrate is rotated about the axis in which the second marks are symmetrical to the first axis. The first and second marks may indeed be identical.

To facilitate easy detection of the second mark, the second mark is offset from the first mark by a known amount.

Figure 5A:
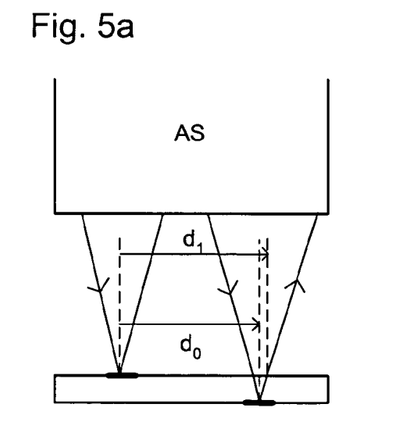
FIG. 5A illustrates a second embodiment of the invention.
Figure 5B:
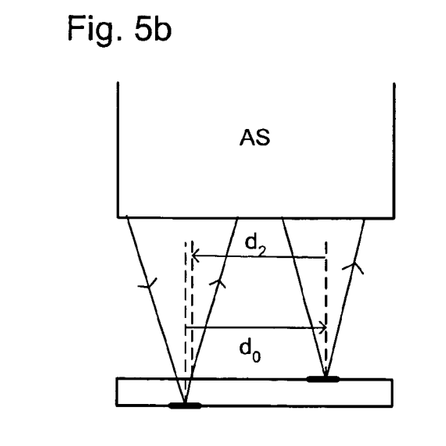
FIG. 5B illustrates a second embodiment of the invention.

A second embodiment 2 is an extension of a first embodiment as described above. As shown in FIG. 5A a non-perpendicular alignment beam may result in an incorrect measurement, $d_1$, of the front-to-backside alignment error. To correct for this error the substrate W is rotated by 180° within the plane of the substrate to the position shown in FIG. 5B. The process of detecting an element of $I_2$ using an alignment system AS then an alignment of $I_1$ and determining the front-to-backside alignment error, $\underline{d}_2$, for a particular location on the substrate is repeated. As can be seen from FIGS. 5A and 5B $\underline{d}_1$, differs from $\underline{d}_2$ and the true value of the front-to-backside alignment error is thus given by $d_0$:

$$\underline{d}_0 = \frac{1}{2}(\underline{d}_1 - \underline{d}_2)$$

Again, this process is repeated for all the repeating elements of $I_1$, and $I_2$.

Errors in this method can be introduced by refractive index variations in the substrate material. The substrate should preferably be made from a high quality material and/or be very thin. Additionally, errors in the perpendicularity of the beam will introduce errors into the front-to-backside alignment error measurement due to the refractive index change between the gaseous surroundings and the substrate. The beam angle should therefore be made as perpendicular as possible and/or the beam angle determined and the error corrected by calculating the change in angle. Reflections between the two surfaces of the substrate and also by the substrate table can cause the image of the mark to shift and also additional images of the mark causing errors in the measurement. To minimise the reflections the beam angle should again be as perpendicular as possible, anti-reflective coatings can be applied to the surfaces of the substrate, a black coating can be applied to the substrate table or the back side of the substrate and/or a system with a phase modulator to reduce the effect of reflections could be used. Additionally, to get a reliable measurement the thickness of the substrate is advantageously uniform. Alternatively, non-uniformity of the substrate can be determined using mapping apparatus and the error compensated for.

For a more accurate reading, after the detection steps the substrate is rotated 180° within the plane of the substrate, the first mark is detected again and the second mark is detected again to measure the displacement, $\underline{d}_2$, between the first mark and the second mark and the front-to-backside alignment error given by $\underline{d}_0$:

$$\underline{d}_0 = \frac{1}{2}(\underline{d}_1 - \underline{d}_2)$$

Any errors introduced by the non-perpendicularity of the detection beam, the non-uniformity of the substrate, reflections between surfaces of the substrate and variations in the refractive index will therefore be reduced. This problem may be particularly pertinent for applications where front to back side alignment optics are used, as any non-orthogonality on the front side may be mirrored on the back side, thereby generating twice the error due to non-orthogonality.

Figure 6:
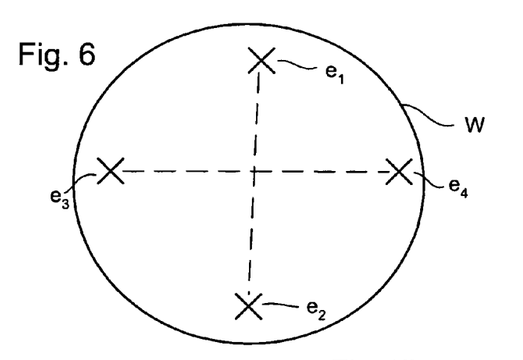
FIG. 6 shows a substrate used in a third embodiment of the invention.

In a third embodiment, a transparent substrate W is etched with marks $e_1$, $e_2$, $e_3$ and $e_4$, each having mirror symmetry. As shown in FIG. 6 the line joining the centers of $e_3$ and $e_4$ is substantially perpendicular to the line joining the centers of $e_1$ and $e_2$.

An alignment system AS is then used to detect the location of $e_1$. The substrate table WT is then moved to bring $e_2$ to the focal point of the alignment system AS and the location of $e_2$ detected. Next, the substrate table WT is moved to bring $e_3$ to the focal point of alignment system AS and the location of $e_3$ detected. This process is repeated again for mark $e_4$.

Figure 7A:
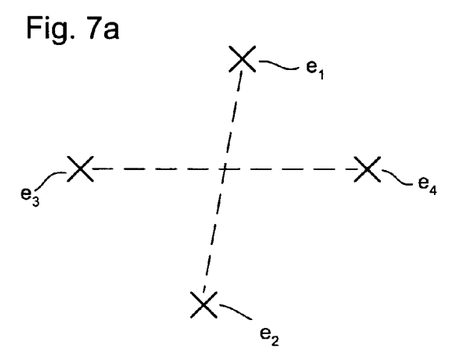
FIG. 7A shows the detected locations of the marks on the substrate shown in FIG. 6.
Figure 7B:
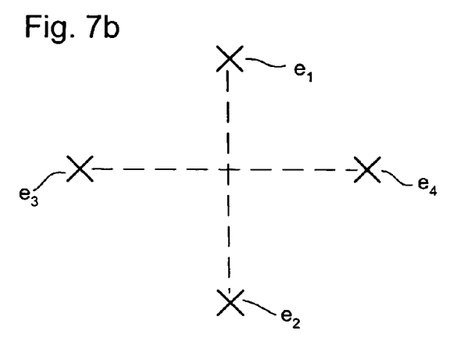
FIG. 7B shows the detected locations of the marks on the substrate shown in FIG. 6.

As the directions in which the substrate table moves are not exactly orthogonal, the detected locations of $e_1$, $e_2$, $e_3$ and $e_4$ may lie along non-orthogonal lines as shown in FIG. 7A. This gives an indication of the non-orthogonality of the movement of the substrate table. However, if the line joining $e_3$ and $e_4$ on the substrate and the line joining $e_1$ and $e_2$ on the substrate are not exactly perpendicular, there will be an error in the measurement. The transparent substrate W is therefore turned over and the locations of marks $e_1$, $e_2$, $e_3$ and $e_4$ again detected. An example of such detected locations is shown in FIG. 7B. The average of the first detected non-orthogonality and the second detected non-orthogonality gives an indication of the true non-orthogonality of the substrate table movement. Furthermore, half the difference between the first detected non-orthogonality and the second detected non-orthogonality gives an indication of the substrate non-orthogonality.

As marks $e_1$, $e_2$, $e_3$ and $e_4$ each have mirror symmetry, the alignment system AS can detect them even when the substrate W is turned over. Alternatively, the marks $e_1$, $e_2$, $e_3$ and $e_4$ may not have mirror symmetry, and mirror images of marks $e_1$, $e_2$, $e_3$ and $e_4$ are etched into the substrate adjacent to each respective mark.

For optimum results a very thin substrate should be used to reduce errors due to optical distortions and/or reflections.

Further embodiments include correctly calibrating a substrate using this method and then using the substrate to calibrate other lithographic apparatus.

The substrate table bearing the substrate can be moved in a plane parallel to the plane of the substrate. Substrate tables are designed to move along two orthogonal axis within this plane, thus having a complete range of movement within this plane. However, if the axes along which the substrate table moves are not completely orthogonal errors in alignment will occur.

Front to back side alignment optics are preferably used to measure the second set of at least two non-parallel displacements. Marks on the underside of the substrate are therefore easily detected.

According to an embodiment of the invention there is a detection beam and the substrate is transparent to the detection beam. Marks on the top side of the substrate can therefore be simultaneously viewed from the top side and from the bottom side.

There may be at least three marks on the substrate, the displacements being the displacements between the marks on the substrate. The first and second set of measured displacements may thus be measured between the same marks. Alternatively, there may be a first set of at least three marks and a second set of at least three marks, the second set being linearly displaced from the first set, each mark being a mirror image of the corresponding mark of the first set. The detection system can therefore easily detect the second set of marks without necessitating a change in the apparatus used. Alternatively, each mark may be symmetrical. As errors in the displacement will be mirrored when the wafer is turned over such errors in the displacement will be eliminated.

For simplicity the displacements are substantially perpendicular to each other. This should enable the non-orthogonality of the substrate table to be easily calculated.

As described above optical distortions and reflections will reduce the accuracy of the measurements. It is therefore preferable to use a thin substrate and ensure that the detection beam is perpendicular to the substrate. To minimise optical distortions and/or reflections further the substrate can be etched to leave only a very thin membrane at the point at which the mark is going to be made.

In some devices device performance is very strongly correlated to the overlay between device layers, and therefore it may be desirable to determine and use the optimum overlay between device layers.

Figure 8:
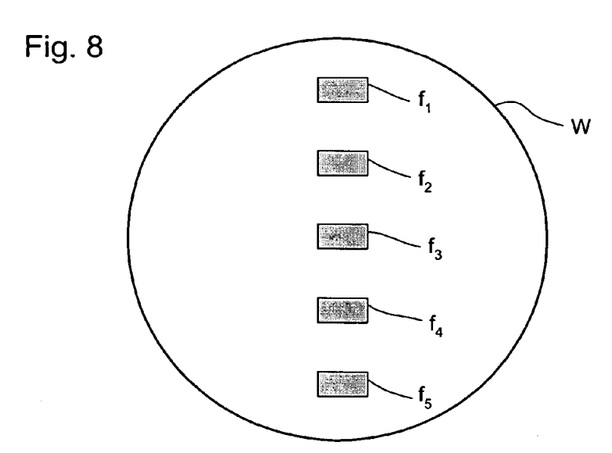
FIG. 8 shows a substrate with a plurality of first device layers printed thereon.
Figure 9A:
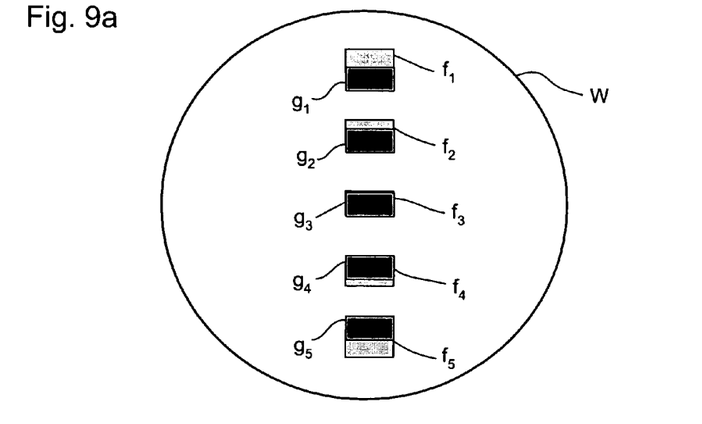
FIG. 9A shows the substrate shown in FIG. 8 with each second device layer having a different y offset from the first device layer.
Figure 9B:
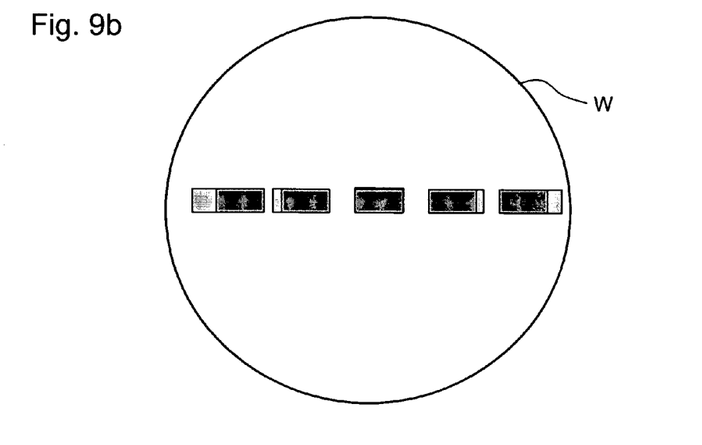
FIG. 9B shows the substrate shown in FIG. 8 with each second device layer having a different x offset from the first device layer.
Figure 9C:
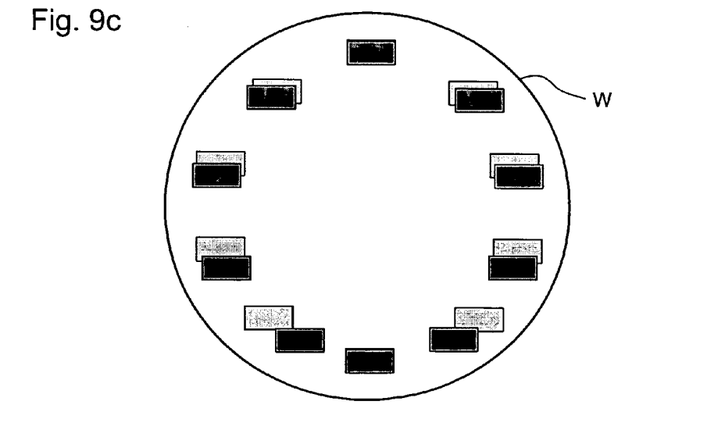
FIG. 9C shows the substrate shown in FIG. 8 with each second device layer having a different rotational offset from the first device layer.
Figure 9D:
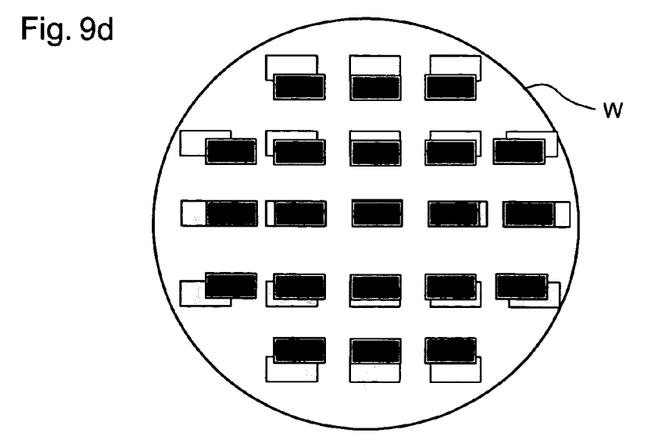
FIG. 9D shows the substrate shown in FIG. 8 with each second device layer having a different magnification offset from the first device layer.
Figure 9E:
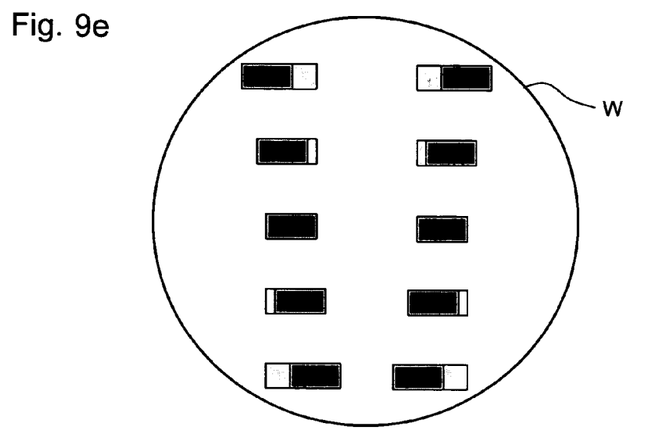
FIG. 9E shows the substrate shown in FIG. 8 with each second device layer having a different x and y offset in a matrix array.

In a fourth embodiment, one layer of a device is printed at a plurality of locations, $f_1$, $f_2$, $f_3$, $f_4$ and $f_5$, on a substrate as shown in FIG. 8. The substrate is then turned over and aligned using front to backside alignment optics and an alignment system AS. For each first layer of the device, f, a second layer of the device, g, is printed on the other side of the substrate. However, for each first layer of the device the second layer is offset in the y direction by a different amount. For example, the first second device layer, $g_1$, is offset from the first first device layer, $f_1$, by −200 nm. The second device layer, $g_1$, is offset from the second first device layer by −100 nm. The third second device layer, $g_1$, is not offset from the third first device layer. This pattern continues for all the devices and is shown in FIG. 9A.

Figure 10:
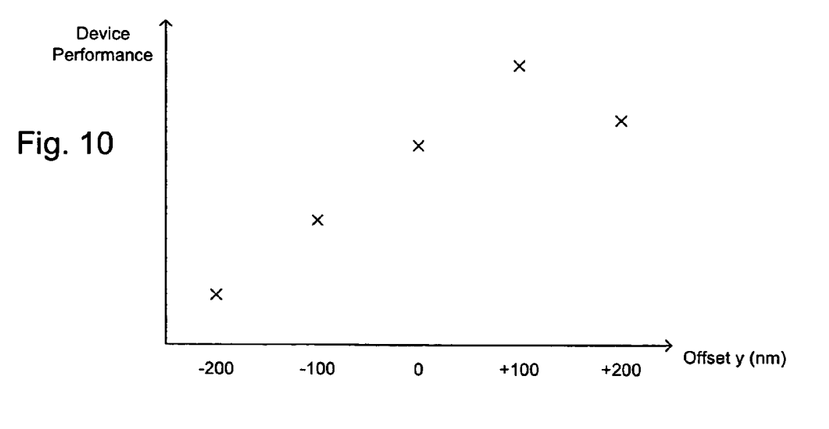
FIG. 10 is a graph showing the device performance for a variety of y offsets.

The substrate is then removed from the lithographic apparatus and the performance of each of the five devices is tested and quantified. The performance of the devices may be as shown in the graph FIG. 10. As can be seen, an offset of +100 nm in the plus y direction yields the optimum performance. The lithographic apparatus can then be set up to ensure that there is always an offset of +100 nm in the y direction. This could be achieved by, for example, changing the machine constant. This method can also be used to compensate for errors in the image to object vector.

For a more accurate calculation of the optimum offset smaller increments of, for example, 50 nm or 20 nm could be used. Although this method has been described for use in conjunction with a y offset it could equally well be used to calculate the optimum x offset, rotation, magnification or a combination of x and y offset as shown in FIGS. 9B, 9C, 9D and 9E respectively.

In general, front-to-backside alignment error is measured using a calibration substrate resulting in an front-to-backside alignment error measurement which is dependent on the quality of the calibration substrate. The front-to-backside alignment error value used is thus independent of the device being created. The performance of some devices is strongly correlated to the front-to-backside alignment error and it is therefore desirable to optimize this.

Figure 11:
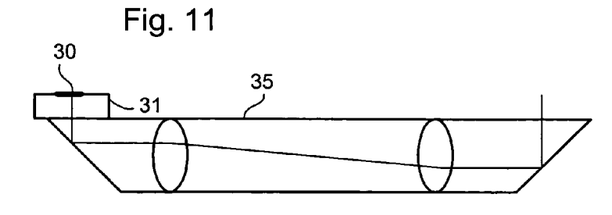
FIG. 11 shows a use of a glass substrate in calibration of front-to-backside alignment optics.
Figure 12:
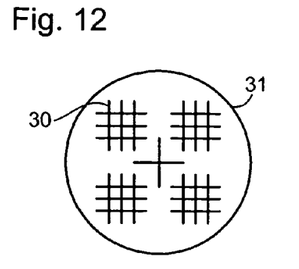
FIG. 12 is a plan view of a glass substrate as may be used in FIG. 11.

In a fifth embodiment, a glass plate 31 with a reference mark 30 etched in aluminum is placed in the object window of front-to-backside alignment optics 35 as shown in FIG. 11. As shown in FIG. 12 the reference mark 30 is symmetrical in both the x and y directions. Alignment system AS detects reference mark 30 from above and through the front-to-backside alignment optics to determine the imaged optic vector. If the apparatus needs recalibrating at a later time the same glass plate can be used for calibration again.

Any discrepancies in the reference mark 30 between being read from above and being read from below (through front-to-backside alignment optics) can be determined using conventional calibration methods. The height of the substrate table may need to be adjusted between these two readings to ensure that the reference mark 30 is at the focal point of alignment system AS.

Alternatively, the reference mark 30 could be etched into the object window of front to backside alignment optics. The reference mark would then permanently be present and calibration would be easy and straightforward.

Such a method does not measure the overlay or evaluate the performance of the front to back side alignment optics but directly tests the operation of the device to determine the effectiveness of the overlay. It is thus independent of the front to back side alignment optics. By adjusting the overlay to optimise the operation of the device a better device will be generated. Such a procedure negates any problems in the, for example, front to back side alignment optics by testing the device itself but it is obviously specific to the device concerned.

The second pattern is preferably at a known offset from the first pattern. The effectiveness of a known offset can therefore be measured. There may be a plurality of first patterns or device layers, forming a first set of device layers, and a plurality of second patterns or device layers forming a second set of device layers, each second device layer corresponding to a first device layer. Each second device layer is preferably offset from the corresponding first device layer by a different amount. Each device created will therefore have a different overlay and the devices are tested to determine the optimum overlay. Alternatively, the method described above can be repeated, a different offset being used for each repetition. The different offsets used may be translations in the plane of the substrate, rotations in the plane of the substrate and/or magnifications.

Calibration of substrates is conventionally done using a calibration substrate with a known offset. The calibration is therefore dependent on the accuracy of the calibration substrate and any damage to the calibration substrate will be reflected in the calibration of the apparatus. Calibration is also time consuming and expensive as a calibration substrate has to be specifically loaded into the apparatus. The calibration of the apparatus may become less accurate over time due to a "drift" in the apparatus.

A method of calibrating front to back side alignment optics according to an implementation of such an embodiment comprises using an alignment mark permanently marked in the object window of the front to back side alignment optics. The alignment mark is preferably etched into the object window of the front to backside alignment optics.

Using this method there is no need to load a calibration substrate in the machine—the procedure is simple, fast and accurate. Calibration of the lithographic apparatus can take place at regular intervals to avoid a drift in the calibration.

As the alignment mark is read out directly from above and below the front to back side alignment offset is determined directly. Any offsets due to the alignment mark being read out from above and below can be calibrated and corrected for.

The alignment mark preferably has mirror symmetry, enabling it to be detected from above and below without changing the reference marks.

The apparatus should preferably be able to move accurately in a direction parallel to the direction of propagation of the projection beam and be able to bring the alignment mark into focus from both sides, i.e. using the front to back side alignment optics and not using the front to back side alignment optics.

Figure 13:
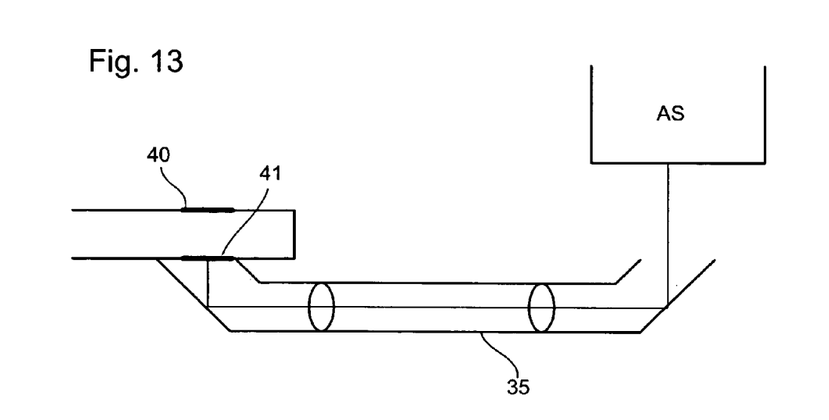
FIG. 13 depicts the apparatus involved in calculating a rotation error.

In a sixth embodiment, a substrate W with a mark 40 on the top side and a mark 41 on the bottom side is placed on a substrate table WT such that mark 41 is in one of the object windows of front to backside alignment optics as shown in FIG. 13. The mark 40 is detected using an alignment system AS and then mark 41 is detected through front-to-backside alignment optics 35 using alignment system AS. The displacement between mark 40 and mark 41 is thus calculated. The substrate is then translated such that mark 41 is in the object window of another branch of front-to-backside alignment optics and the displacement between mark 40 and mark 41 again calculated. The difference between the two calculated displacements indicates the asymmetric rotation error.

Calibration of lithographic apparatus may involve the measurement of translational errors, rotational errors and/or magnification errors. Of these the largest error is the rotational error which is only able to be measured to an accuracy of 500 nm, far greater than the values for the translational or magnification errors. Present methods of calibrating rotation include the use of a glass substrate. However, this introduces errors due to the properties of the glass.

The rotational error of the apparatus is thus detected with greater accuracy. The first and second marks are preferably substantially opposite each other on opposite sides of the substrate.

The second mark is preferably detected using front to back side alignment optics. The first position of the second mark is preferably detected using a first branch of the front to back side alignment optics and the second position of the second mark is detected using a second branch of the front to back side alignment optics.

Figures 14A, 14B:
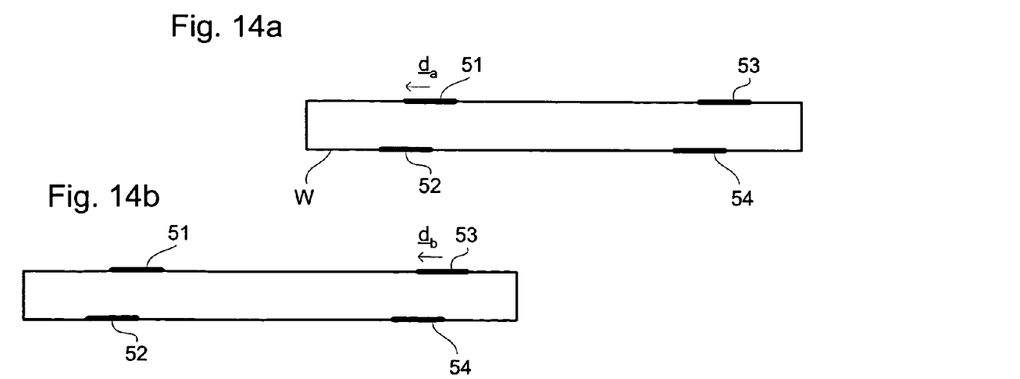
FIG. 14a shows marks on a substrate as may be used in a seventh embodiment of the invention.
FIG. 14b shows a substrate as shown in FIG. 14a having been translationally moved.

In a seventh embodiment, a substrate is marked with first and second marks 51, 53 on a first side and third and fourth marks 52, 54 on a second side opposite the first mark. As shown in FIG. 14, the first and third marks are substantially opposite each other, and the second and fourth marks are substantially opposite each other.

An alignment system AS is used to detect the location of first mark 51 and second mark 53 and, using front-to-backside alignment optics, the third mark 52. A displacement vector $\underline{d}_a$ between the first mark 51 and the third mark 52 is thus calculated. The substrate is then translationally moved in the plane of the substrate W such that the fourth mark 54 is in the object window of the same branch of the front to backside alignment optics as shown in FIG. 14b. The locations of the first and second marks 51, 53 are detected again and the location of the fourth mark 54 is detected using the front to backside alignment optics. A second displacement sector $\underline{d}_b$ between the third and fourth marks 53, 54 is determined. The rotational error is then given by $$\underline{Rot}^* d\underline{x} = \underline{d}_a - \underline{d}_b$$

where x is the distance between the first and second alignment marks 51, 53.

Although this method has been described using just one mark on the first and second sides of the substrate, the use and calibration of more marks would result in greater accuracy. Supplementary marks on the back side of the substrate could be projected through a different branch of front to backside alignment optics to simultaneously detect their locations.

The first and second marks should preferably be as far apart as possible, i.e. x should be as large as possible.

In a further implementation, a substrate that has been correctly calibrated using such a method is used to calibrate other lithographic apparatus, particularly in respect of the rotational error.

A single substrate can thus be used to determine the translational, magnification and rotational errors of an apparatus. A further advantage of this method is that no prior knowledge of the position of marks on the wafer is necessary.

The alignment may use front to back side alignment optics but could also be used to characterize any other alignment method.

The first and third marks (and the second and fourth marks) are preferably substantially opposite to each other. The substrate is preferably translationally moved at least 2 cms. The larger the translational movement the greater the accuracy with which the apparatus will be calibrated.

While specific embodiments have been described above, it will be appreciated that the invention may be practiced otherwise than as described. In addition, embodiments also include computer programs (e.g. one or more sets or sequences of instructions) to control a lithographic apparatus to perform a method as described herein, and storage media (e.g. disks, semiconductor memory) storing one or more such programs in machine-readable form. The description is not intended to limit the invention.

We claim:

1. A method of measuring an alignment error, said method comprising:
   using a first patterning structure to impart a beam of radiation with a first pattern in its cross-section;
   projecting the beam having the first pattern onto a first side of a substrate to create a first mark;
   subsequent to said projecting the beam having the first pattern, turning said substrate over;
   aligning said substrate with respect to a reference position;
   using a second patterning structure to impart a beam of radiation with a second pattern in its cross-section;
   projecting the beam having the second pattern onto a second side of said substrate, said second side being substantially opposite to said first side, to create a second mark;
   detecting a position of said first mark on said first side of said substrate in a plane substantially parallel to said first side; and
   detecting a position of said second mark on said second side of said substrate in a plane substantially parallel to said second side,
   wherein said substrate is transparent to the beams of radiation, and
   wherein, between said detecting a position of said first mark and said detecting a position of said second mark, the substrate remains stationary relative to a substrate table holding said substrate.

2. The method of measuring according to claim 1, said method comprising, based on a result of said detecting a position of said first mark and a result of said detecting a position of said second mark, determining a displacement between said first mark and said second mark in a plane substantially parallel to said first side.

3. The method of measuring according to claim 1, wherein said second mark is a mirror image of said first mark.

4. The method of measuring according to claim 1, wherein said detecting a position of said first mark and said detecting a position of said second mark are performed using a detection system,
   wherein during said detecting a position of said first mark, said first mark is located in a focal plane of said detection system, and
   wherein during said detecting a position of said second mark, said second mark is located in the focal plane of said detection system.

5. The method of measuring according to claim 1, wherein said second mark is offset from said first mark by a known amount.

6. The method of measuring according to claim 1, wherein said first and second marks are substantially identical.

7. The method of measuring according to claim 1, wherein said aligning is performed using front to back side alignment optics.

8. The method of measuring according to claim 1, wherein said projecting the beam having the first pattern comprises projecting at least one beam having the first pattern onto the first side of said substrate to create a plurality of first marks, and
   wherein said projecting the beam having the second pattern comprises projecting at least one beam having the second pattern onto the second side of said substrate to create a plurality of second marks, each of said plurality of second marks corresponding to one of the plurality of first marks.

9. A method of measuring according to claim 1, said method comprising: subsequent to said detecting a position of said first mark and said detecting a position of said second mark, rotating said substrate about an axis substantially perpendicular to said first side by substantially one-hundred-eighty degrees; and subsequent to said rotating, detecting a second position of said first mark on said first side of said substrate in a plane substantially parallel to said first side and detecting a second position of said second mark on said second side of said substrate in a plane substantially parallel to said second side.

10. The method of measuring according to claim 8, wherein said plurality of second marks is a mirror image of said plurality of first marks.

11. The method of measuring according to claim 10, wherein said turning said substrate over comprises turning said substrate about an axis parallel to an axis of symmetry of at least one of said plurality of second marks.

12. A method of measuring according to claim 9, said method comprising, based on a result of said detecting a position of said first mark and a result of said detecting a position of said second mark, determining a first displacement between said first mark and said second mark in a plane substantially parallel to said first side and based on a result of said detecting a second position of said first mark and said detecting a second position of said second mark, determining a second displacement between said first mark and said second mark in a plane substantially parallel to said first side.

13. A method of measuring according to claim 12, said method comprising calculating an overlay value based on a difference between said first and second displacements.

14. A method of measuring an alignment error, said method comprising:
   using a first patterning structure to impart a beam of radiation with a first pattern in its cross-section;
   projecting the beam having the first pattern onto a first side of a substrate to create a first mark;
   subsequent to said projecting the beam having the first pattern, turning said substrate over;
   aligning said substrate with respect to a reference position;
   using a second patterning structure to impart a beam of radiation with a second pattern in its cross-section;
   projecting the beam having the second pattern onto a second side of said substrate, said second side being substantially opposite to said first side, to create a second mark;
   detecting from the first side a position of said first mark on said first side of said substrate in a plane substantially parallel to said first side; and
   detecting from the first side, through the substrate, a position of said second mark on said second side of said substrate in a plane substantially parallel to said second side,
   wherein said substrate is transparent to an alignment beam of radiation,
   wherein, between said detecting a position of said first mark and said detecting a position of said second mark, the substrate remains stationary relative to a substrate table holding said substrate, and
   wherein said second mark is a mirror image of said first mark.

15. The method of measuring according to claim 14, wherein said detecting a position of said first mark and said detecting a position of said second mark are performed using a detection system,
   wherein during said detecting a position of said first mark, said first mark is located in a focal plane of said detection system, and
   wherein during said detecting a position of said second mark, said second mark is located in the focal plane of said detection system.

16. The method of measuring according to claim 14, wherein said second mark is offset from said first mark by a known amount.

17. The method of measuring according to claim 14, wherein said first and second marks are substantially identical.

18. The method of measuring according to claim 14, wherein said aligning is performed using front to back side alignment optics.

19. The method of measuring according to claim 14, said method comprising, based on a result of said detecting a position of said first mark and a result of said detecting a position of said second mark, determining a first displacement between said first mark and said second mark in a plane substantially parallel to said first side.

20. The method of measuring according to claim 14, wherein said projecting the beam having the first pattern comprises projecting at least one beam having the first pattern onto the first side of said substrate to create a plurality of first marks, and
   wherein said projecting the beam having the second pattern comprises projecting at least one beam having the second pattern onto the second side of said substrate to create a plurality of second marks, each of said plurality of second marks corresponding to one of the plurality of first marks.

21. A method of measuring according to claim 19, said method comprising:
   subsequent to said detecting a position of said first mark and said detecting a position of said second mark, rotating said substrate about an axis substantially perpendicular to said first side by substantially one-hundred-eighty degrees; and
   subsequent to said rotating, detecting a second position of said first mark on said first side of said substrate in a plane substantially parallel to said first side and detecting a second position of said second mark on said second side of said substrate in a plane substantially parallel to said second side.

22. A method of measuring according to claim 21, said method comprising, based on a result of said detecting a second position of said first mark and said detecting a second position of said second mark, determining a second displacement between said first mark and said second mark in a plane substantially parallel to said first side.

23. A method of measuring according to claim 22, said method comprising calculating an overlay value based on a difference between said first displacement and second displacements.

24. The method of measuring according to claim 20, wherein said plurality of second marks is a mirror image of said plurality of first marks.

25. The method of measuring according to claim 24, wherein said turning said substrate over comprises turning said substrate about an axis parallel to an axis of symmetry of at least one of said plurality of second marks.

* * * * *